United States Patent
Marom et al.

(10) Patent No.: US 7,854,558 B2
(45) Date of Patent: Dec. 21, 2010

(54) DEVELOPER WASTE REUSE

(75) Inventors: Moshe Marom, Kfar Saba (IL); Kalman Shamir, Herzlia (IL)

(73) Assignee: Eastman Kodak Company, Rochester, NY (US)

( * ) Notice: Subject to any disclaimer, the term of this patent is extended or adjusted under 35 U.S.C. 154(b) by 33 days.

(21) Appl. No.: 12/371,667

(22) Filed: Feb. 16, 2009

(65) Prior Publication Data

US 2010/0209098 A1 Aug. 19, 2010

(51) Int. Cl.
*G03D 3/06* (2006.01)
(52) U.S. Cl. ..................................... 396/578
(58) Field of Classification Search .................. 396/578
See application file for complete search history.

(56) References Cited

U.S. PATENT DOCUMENTS

| | | | |
|---|---|---|---|
| 4,046,655 A * | 9/1977 | Itai et al. ................. | 205/688 |
| 4,969,002 A | 11/1990 | Nakayama | |
| 5,842,074 A * | 11/1998 | Nishida et al. ............. | 396/578 |
| 5,930,547 A | 7/1999 | Stein et al. | |
| 6,302,600 B1 * | 10/2001 | Nagase et al. ............. | 396/611 |
| 6,866,432 B2 * | 3/2005 | Sasayama .................. | 396/571 |
| 6,969,572 B2 * | 11/2005 | Tateyama et al. ........... | 430/30 |
| 2003/0096199 A1 * | 5/2003 | Nakagawa et al. .......... | 430/325 |

FOREIGN PATENT DOCUMENTS

| | | |
|---|---|---|
| EP | 0 346 871 A2 | 12/1989 |
| EP | 0 415 392 A2 | 3/1991 |

* cited by examiner

*Primary Examiner*—W. B. Perkey
(74) *Attorney, Agent, or Firm*—Nelson Adrian Blish

(57) ABSTRACT

An apparatus for reusing developer liquid in a plate processor device includes: a new developer liquid container (13); a work in progress developer liquid tank (10) for plate processing is filled with developer liquid (15) from the new developer liquid container (13); a waste developer liquid container (14) configured to receive spilled over developer liquid (16) from the work in progress developer liquid tank (10); and replenish means configured to replenish the waste developer liquid (21) from the waste developer liquid container (14) back according to the conductivity level of the waste developer liquid.

7 Claims, 3 Drawing Sheets

DEVELOPER WASTE REUSE

FIELD OF THE INVENTION

This present invention relates to an apparatus and method for replenishment of developer liquid, inside a plate developing processor machinery for the printing industry.

BACKGROUND OF THE INVENTION

Lithographic digital printing plates are imaged on special opto-mechanical plate setters. The imaged plates should undergo a chemical development stage, this process is usually performed by a plate developing processor device. The development process uses chemical development material in a liquid form. The material is filled into the developer section tank 10 within the plate processor device, as described in the prior art FIG. 1.

Each time a lithographic plate is imaged, it will be transported into the plate processor device for processing, consuming a portion of the development liquid in developer section tank 10. The developer liquid 12 inside developer section tank 10 should be maintained at fixed level. After each plate development cycle, new developer liquid is replenished from fresh developer container 13 via developer replenish pipe system 15. The new developer material from fresh developer container 13 will flow into developer section tank 10, while maintaining the developer liquid level 12. In order to keep developer liquid level 12 fixed, part of the developer liquid from developer section tank 10 will be drained into the developer waste container 14, via developer waste overflow pipe system 16.

At the point where developer waste container 14 is filled up with waste material, the material has to be safely removed and destroyed. This material is hazardous by nature to the environment, and as such yields a costly removal process.

The invention disclosed hereunder, proposes extending the usage of the development material to a plurality of plate development cycles, causing the reduction of wasted material and removal events.

SUMMARY OF THE INVENTION

Briefly, according to one aspect of the present invention an apparatus for reusing developer liquid in a plate processor device is presented. The apparatus comprises, a new developer liquid container, a work in progress developer liquid tank which is used for plate processing and is filled with a developer liquid from the new developer liquid container, a waste developer liquid container configured to receive spilled over developer liquid from the work in progress developer liquid tank.

The apparatus additionally comprises replenish means configured to replenish the waste developer liquid from the waste developer liquid container back according to the conductivity level of the waste developer liquid.

These and other objects, features, and advantages of the present invention will become apparent to those skilled in the art upon a reading of the following detailed description when taken in conjunction with the drawings wherein there is shown and described an illustrative embodiment of the invention.

DETAILED DESCRIPTION OF THE INVENTION

Figure 1:
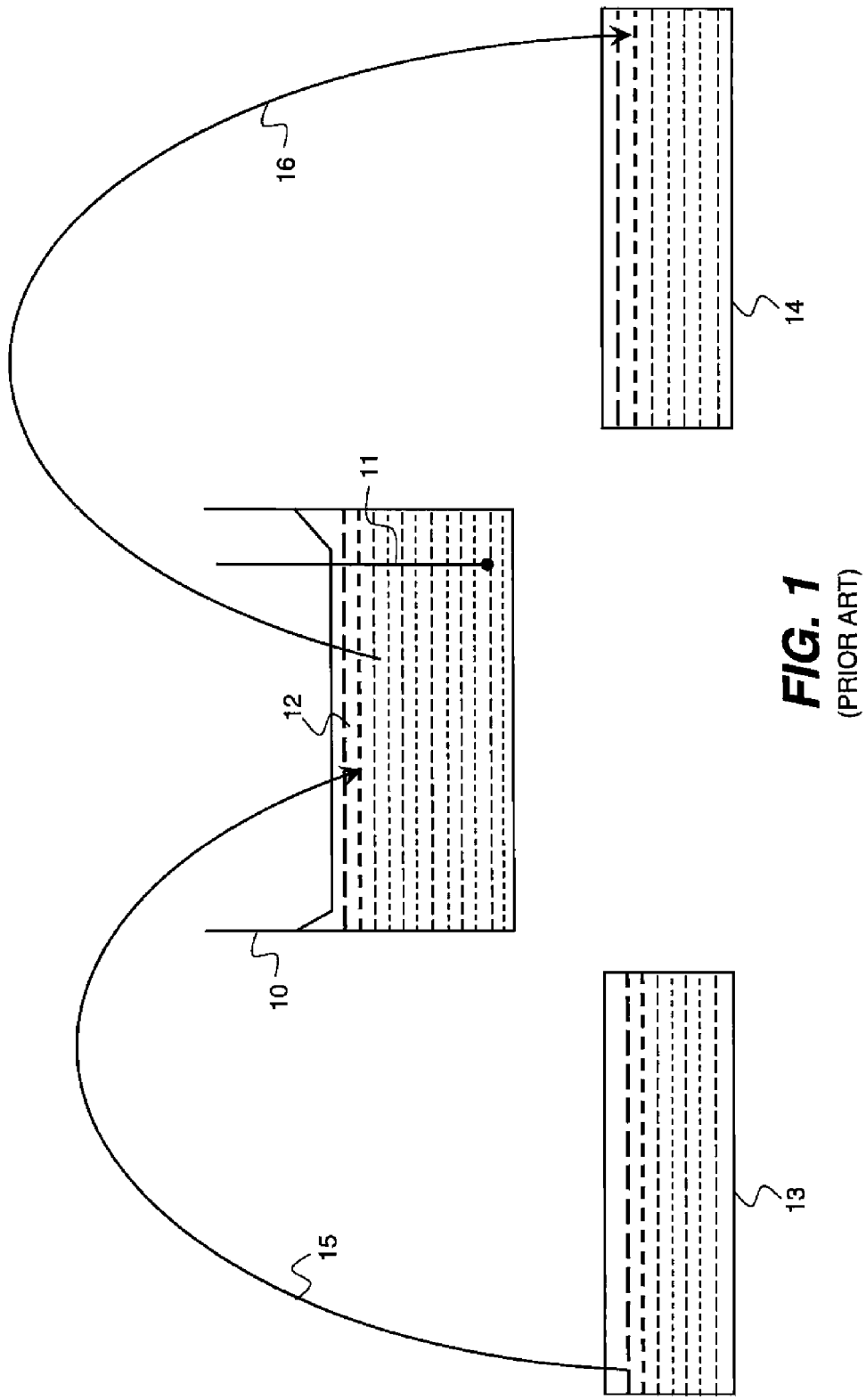
FIG. 1 is a prior art schematic illustrating a developer liquid flow between the developer section tank, the fresh developer material container and developer waste material container.

The present embodiments enable reusing of the developer material wasted due to plate developing process plurality of times, thus reducing the events of wasted material removal.

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

Figure 2:
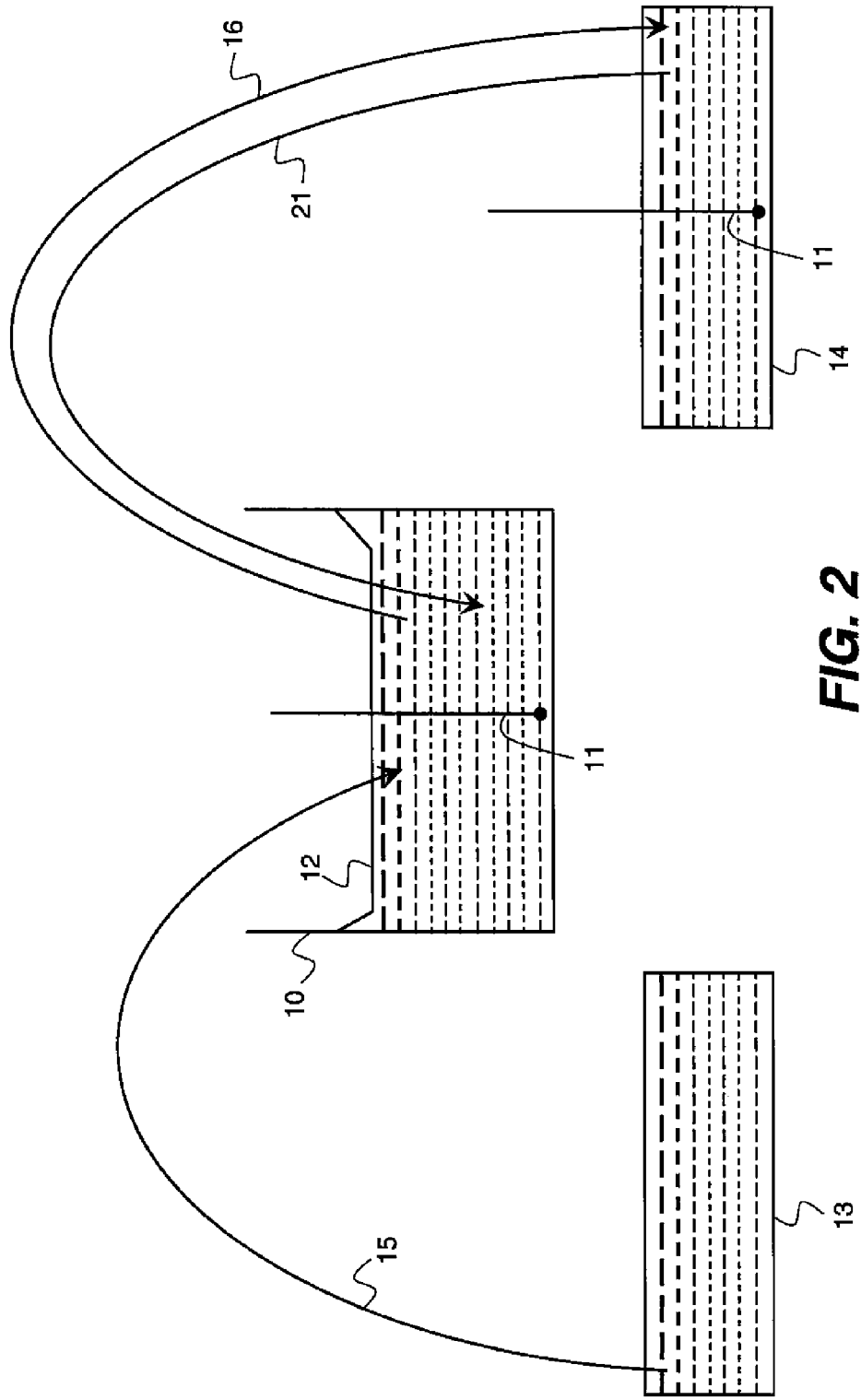
FIG. 2 is a schematic illustrating a developer liquid flow between the developer section tank, the fresh developer material container and developer waste material container used in the disclosed invention.
Figure 3:
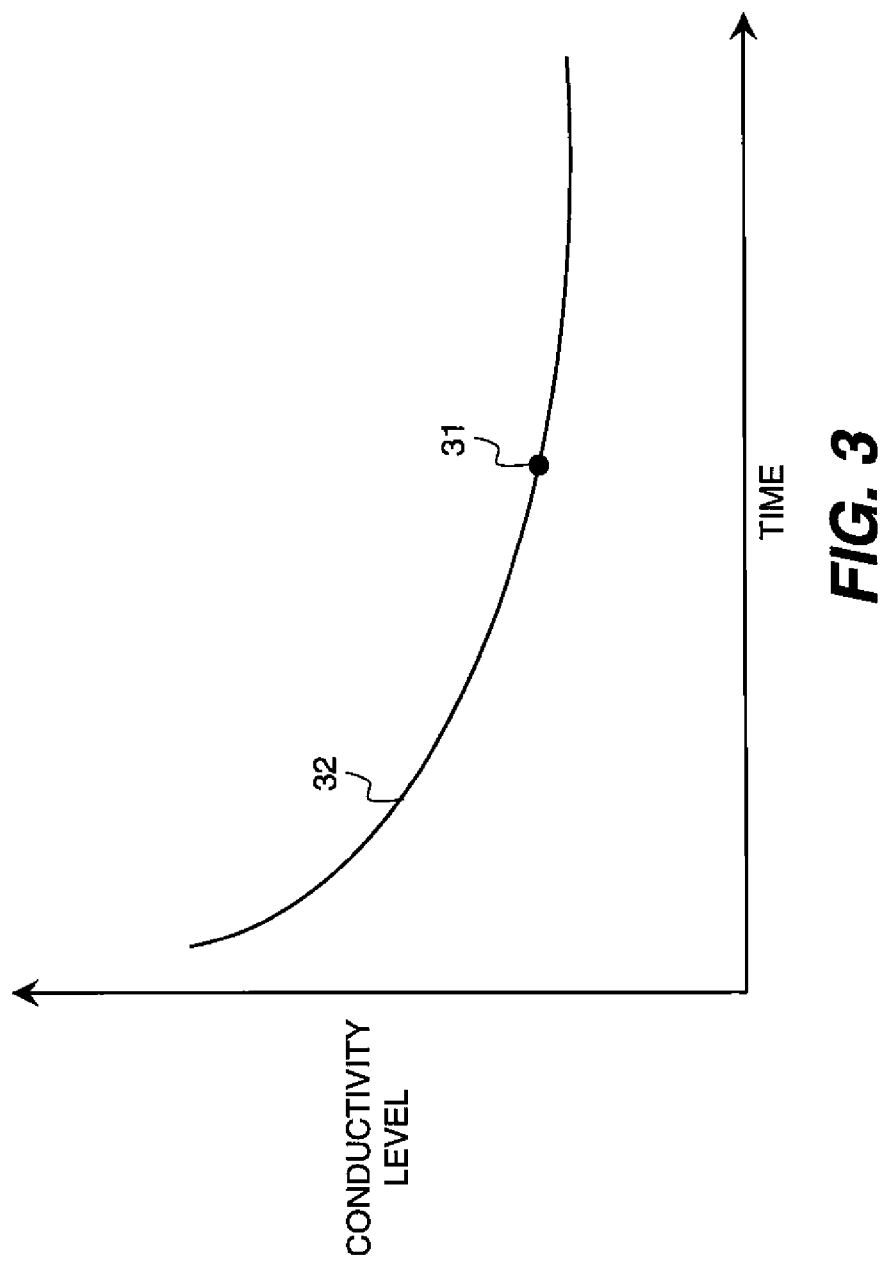
FIG. 3 is a chart illustrating the behavior function of the developer material conductivity level changing over time.

Referring to FIG. 2, the proposed invention suggests reusing certain portions of the wasted material drained into developer waste container 14. The material from developer waste container 14 will be made to flow back into developer section tank 10 via reused developer pipe system 21, while maintaining developer liquid level 12 in developer section tank 10. After each plate development cycle, conductivity level of the material in developer section tank 10 will be read, using conductivity level probe 11. The reuse of developer material from developer waste container 14 will continue for each consecutive plate development cycle, till the point where the conductivity level reaches the conductivity level break even point 31, as it is illustrated in FIG. 3.

The proposed invention is based on the fact that the conductivity level is degraded over time and/or usage, but the developer material can be still reused multiple times. Referring to FIG. 3, it shows conductivity level behavior function 32, whereas conductivity level degrades over time and usage, till it reaches the conductivity level break even point 31. As had been indicated earlier, when the conductivity level reaches break even point 31, the developer in the waste container 14 can not be reused anymore for plate development. At this stage the material in developer waste container 14 should be safely removed and destroyed.

This invention enables to prolong the usage of the developer material in the system, thus reducing the total amount and cost of developer liquid required per plate development. In addition it also reduces the total amount of developer waste material and number of waste container removal events, which results favorably in respect to environmental friendliness and reducing waste removal cost.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein.

It will be appreciated by persons skilled in the art that the present invention is not limited to what has been particularly shown and described hereinabove. Rather the scope of the present invention is defined by the appended claims and includes both combinations and sub-combinations of the various features described hereinabove as well as variations and modifications thereof, which would occur to persons skilled in the art upon reading the foregoing description.

PARTS LIST 10 developer section tank
11 conductivity level probe
12 developer liquid level
13 fresh developer container
14 developer waste container
15 developer replenish pipe system
16 developer waste overflow pipe system
21 reused developer pipe system
31 conductivity level break even point
32 conductivity level behavior function

The invention claimed is:

1. An apparatus for reusing developer liquid in a plate processor device comprising:
   a first tank containing developer liquid;
   a second tank for processing plates in said developer liquid;
   a third tank containing waste developer liquid received from said second tank;
   replenish means configured to replenish said second tank with waste developer liquid from said third tank when said waste developer liquid is greater than a specified conductivity; and
   wherein developer liquid in said second tank is supplied from said first tank when said waste developer liquid in said third tank is less than a specified conductivity.

2. The apparatus of claim 1 comprising:
   a conductivity level probe in said third tank configured to measure a conductivity level of developer liquid in said third tank.

3. The apparatus of claim 1 comprising:
   a conductivity level probe in said second tank configured to measure a conductivity level of developer liquid in said second tank; and
   wherein conductivity in said third tank is calculated based on a change in conductivity in said second tank.

4. A method for reusing developer liquid in a plate processor device, the method comprising:
   filling a work in progress tank with fresh developer liquid from a first tank;
   processing plates with said fresh developer liquid;
   collecting waste developer liquid spilled during processing into a waste developer liquid container; and
   replenishing said work in progress tank with waste developer liquid if a conductivity level of said waste developer liquid in said waste developer liquid container is greater than a specified level.

5. The method of claim 4 comprising:
   replenishing said work in progress tank with fresh developer liquid back if a conductivity level of said waste developer liquid is less than a specified level.

6. The method of claim 4 comprising:
   measuring a conductivity level of developer liquid in said work in progress tank; and
   calculating said conductivity level in said waste developer liquid container based upon the measured conductivity level of developer liquid in said work in progress tank and an amount of developer liquid spilled, over time, into said waste developer liquid container.

7. An apparatus for reusing developer liquid in a plate processor device comprising:
   a first tank containing developer liquid;
   a second tank for processing plates in said developer liquid;
   a third tank containing waste developer liquid received from said second tank;
   replenish means configured to replenish said second tank with waste developer liquid when said developer liquid in said second tank is greater than a specified conductivity; and
   wherein developer liquid in said second tank is supplied from said first tank when said developer liquid in said second tank is less than a specified conductivity.

* * * * *